United States Patent [19]
Burton et al.

[11] Patent Number: 5,757,206
[45] Date of Patent: May 26, 1998

[54] ELECTRONIC CIRCUIT WITH PROGRAMMABLE GRADUAL POWER CONSUMPTION CONTROL

[75] Inventors: Edward A. Burton, Lindon; Farrell L. Ostler, Provo, both of Utah

[73] Assignee: Philips Electronics North America Corp., New York, N.Y.

[21] Appl. No.: 426,442

[22] Filed: Apr. 21, 1995

Related U.S. Application Data

[63] Continuation of Ser. No. 150,339, Nov. 10, 1993, abandoned, which is a continuation of Ser. No. 799,500, Nov. 27, 1991, abandoned.

[51] Int. Cl.$^6$ .................. H03K 19/177; H03K 19/01
[52] U.S. Cl. .............. 326/39; 326/26; 326/126; 327/380
[58] Field of Search .............. 307/465–9, 296.3; 365/227; 327/544, 380; 326/38, 39, 26, 27, 126

[56] References Cited

U.S. PATENT DOCUMENTS

| | | | |
|---|---|---|---|
| 4,506,137 | 3/1985 | Yum | 307/466 |
| 4,532,612 | 7/1985 | Tanaka et al. | 365/227 |
| 4,645,953 | 2/1987 | Wong | 307/465 |
| 4,801,820 | 1/1989 | Nootbaar | 307/465 |
| 4,857,773 | 8/1989 | Takata et al. | 326/39 |
| 4,959,564 | 9/1990 | Steele | 307/465 |
| 4,999,516 | 3/1991 | Suter et al. | 365/227 |
| 5,045,717 | 9/1991 | Moen, Jr. et al. | 365/227 |
| 5,099,148 | 3/1992 | McClure et al. | 326/33 |
| 5,122,691 | 6/1992 | Balakrishnan | 326/86 |
| 5,128,558 | 7/1992 | Owens et al. | 307/465 |
| 5,134,311 | 7/1992 | Biber et al. | 326/38 |
| 5,225,720 | 7/1993 | Kondoh | 327/544 |

FOREIGN PATENT DOCUMENTS

| | | | |
|---|---|---|---|
| 337676 | 10/1989 | European Pat. Off. | |
| 52-137228 | 11/1977 | Japan . | |
| 52-137229 | 11/1977 | Japan . | |
| 63-5617 | 1/1988 | Japan | 326/126 |
| 1-147915 | 6/1989 | Japan | 326/126 |
| 2-301219 | 12/1990 | Japan | 326/126 |

*Primary Examiner*—Edward P. Westin
*Assistant Examiner*—Benjamin D. Driscoll
*Attorney, Agent, or Firm*—Brian J. Wieghaus

[57] ABSTRACT

An electronic device comprises a circuit that is provided with incrementally modifiable power consumption control means. By applying a program signal to this control means the balance between speed and power consumption is optimized. A PLA circuit considerably benefits from this architecture.

16 Claims, 2 Drawing Sheets

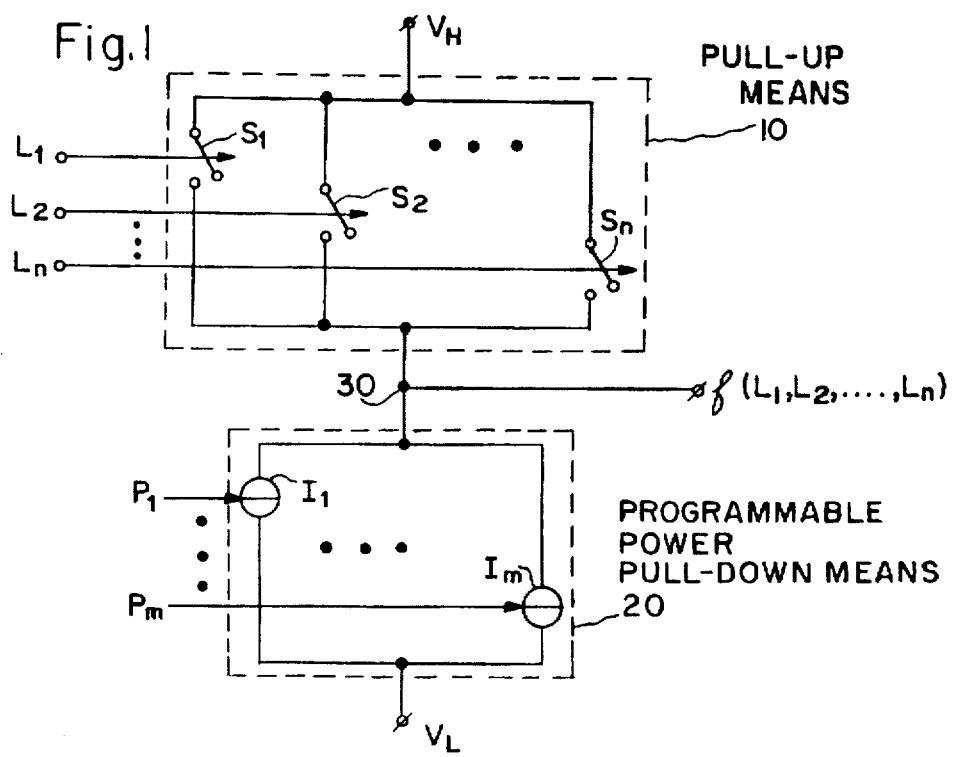
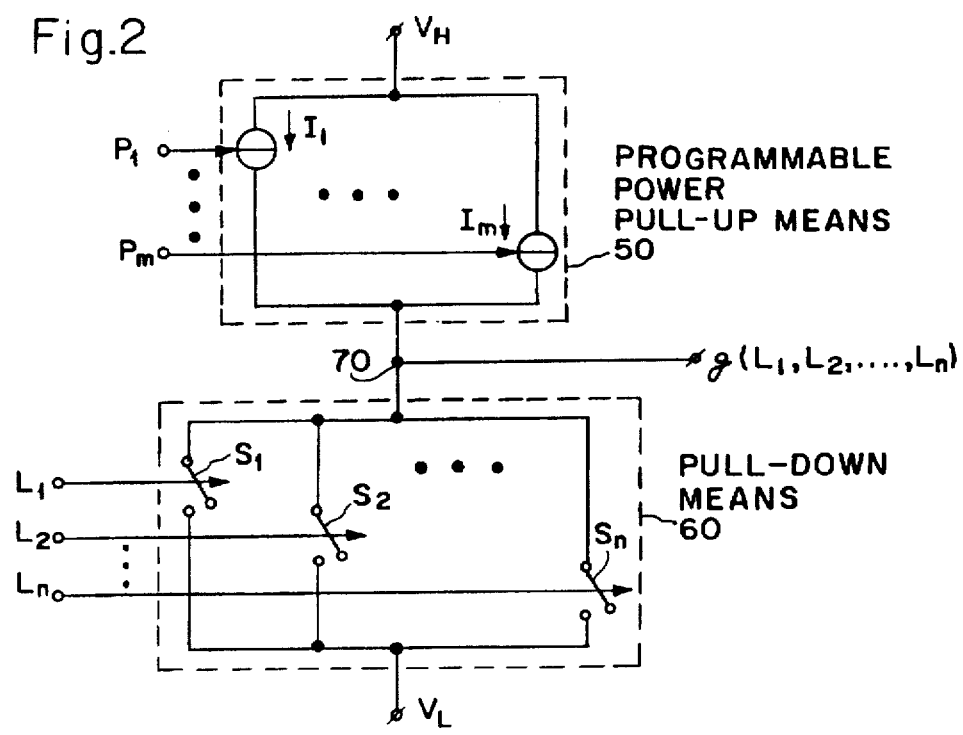

ELECTRONIC CIRCUIT WITH PROGRAMMABLE GRADUAL POWER CONSUMPTION CONTROL

This is a continuation of application Ser. No. 08/150,339, filed Nov. 10, 1993, abandoned which is a continuation of application Ser. No. 07/799,500, filed Nov. 27, 1991, abandoned.

FIELD OF THE INVENTION

This invention relates to an electronic device with first and second power supply nodes for receiving first and second power supply voltages, respectively, and with a circuit coupled between the first and second power supply nodes. The device further comprises a programmable control means coupled to the circuit for controlling the circuit's power consumption via the power supply nodes.

BACKGROUND ART

Many electronic devices, notably those in the so-called PLD (programmable logic device) class, are offered as generic building blocks for implementing logic functions in larger systems. Systems are usually concerned with both performance, i.e., speed of operation, and power consumption. Generally, high speed and low power consumption are mutually conflicting requirements, especially in the field of programmable logic arrays (PLAs).

Typically, a PLA is functionally made up of a programmable AND plane followed by a fixed or programmable OR plane. Each of these planes comprises a large number of logic gates with a large number of inputs. Owing to speed and density considerations, these gates are usually constructed in a "wired AND" or a "wired OR" configuration, i.e., a large number of parallel transistors opposed by a source of current (e.g., a resistor).

"Wired OR/AND" configurations are characterized by high speed operation and high gate densities. Their major drawback is high power consumption. Even CMOS versions of the most common architectures usually dissipate as much as 500 mW per part. This makes this type of PLD unsuitable for use in battery powered applications and increases the demand on thermal control features and power supply.

U.S. Pat. No. 4,645,953 of Wong discloses a PLA with programmable power consumption control means. The known PLA comprises current sources, each for powering the associated product term of the array. The PLA also includes a programmable control means for power consumption control. The programmable control means consists of a fuse between each product term and the associated current source. When a Boolean function to be implemented in the PLA does not need the participation of particular product-terms, those terms are disabled by blowing the corresponding fuses. In this way, power consumption is reduced by permanently and selectively disconnecting the current source from the product-term.

If a compromise between propagation delay and power consumption is under control of a system designer at a finer grain than is the case in the prior art, the designer has another tool for more closely approximating the optimum balance between speed and energy.

OBJECT OF THE INVENTION

It is therefore an object of the invention to provide an electronic device that incorporates more degrees of freedom than in the prior art in order to establish an optimum adjustment of the device regarding both speed and power consumption criteria.

SUMMARY OF THE INVENTION

To this end, the invention provides an electronic device that has first and second power supply nodes for receiving first and second power supply voltages, respectively. The device includes a circuit coupled between the first and second power supply nodes. The device further comprises user-programmable control means coupled to the circuit for incrementally modifying its power consumption under control of a program signal applied to the control means.

An incremental chance in power consumption enables the user to tailor the power consumption-performance characteristics of the device in the invent on more accurately than would be possible in the prior art. Moreover, the manufacturer is able to standardize this type of product leaving it to the user to program the device after fabrication.

Generally, the circuit has, in addition to speed-critical parts, parts that are less critical regarding speed and redundant parts. Individually programming the power consumption for each kind permits the user to optimize the speed/power consumption interrelationship.

A PLA, e.g., a field programmable gate array (FPGA) or a field programmable logic sequencer (FPLS), typically incorporates a very high number of logic gates. Especially in this technical area, the architecture of tie invention leads to considerable power consumption reduction at no substantial loss of speed, by categorizing the gases in groups according to their degree of criticality regarding speed and by individually programming the power consumption per group.

Note that the tailoring of the power consumption may be based on a more refined division of the circuit parts than the division in speed critical, speed non-critical and redundant circuit parts. Note also that the invention is not limit PLAs.

BRIEF DESCRIPTION OF THE DRAWING

The invention is explained below by way of example and with reference to the drawing, wherein:

FIG. 1 shows a first example of a device in the invention, dealing with wired OR or wired AND types of logic (open collector/drain logic);

FIG. 2 gives a second example of a device of the invention, dealing with wired OR or wired AND types of logic;

Figure 3:
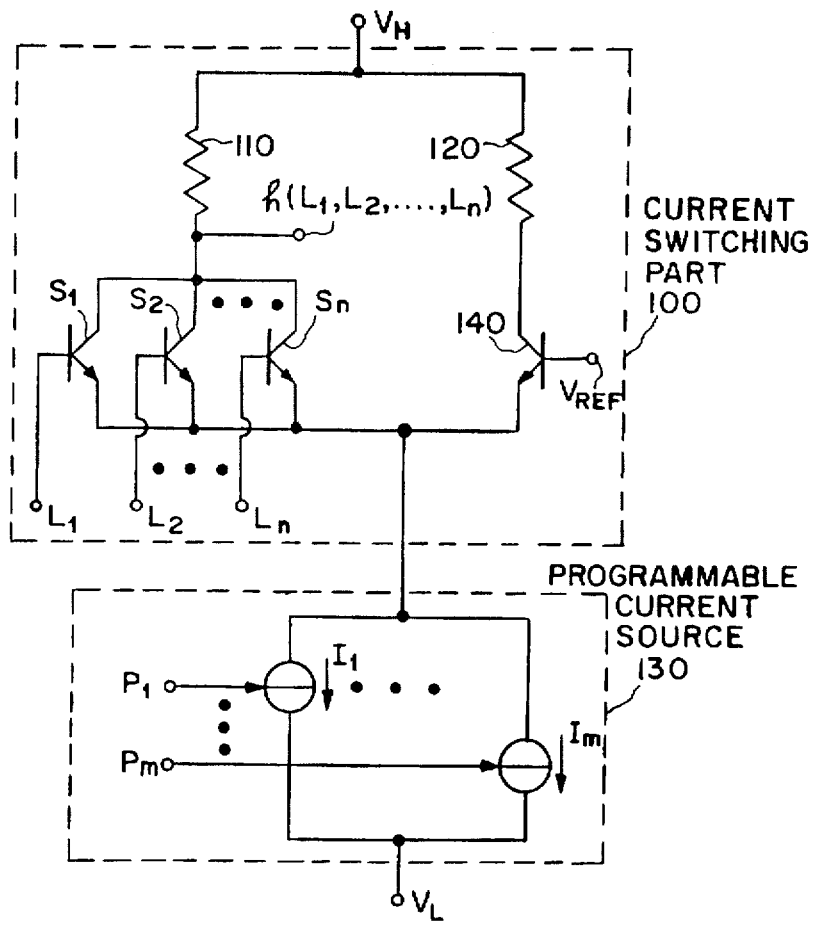
FIG. 3 represents an example of a device of the invention based on current switching logic.

DETAILED DESCRIPTION
WIRED LOGIC, FIRST EXAMPLE

FIG. 1 shows a circuit in a PLA as a first example according to the invention. The PLA uses so-called wired logic. Pull-up means 10 and programmable power pull-down means 20 are arranged in series between high-voltage supply node $V_H$ and low-voltage supply node $V_L$. Pull-up means 10 includes a plurality of switches S1-Sn that are respectively controlled by input signals L1-Ln. Pull-down means 20 comprises current sources I1-Im. While pull-down means 20 is active, that is, drawing current from output node 30 towards supply node $V_L$, output node 30 provides an output voltage f(L1, . . . , Ln) that is a function of input signals L1-Ln.

The character of the output voltage f also depends on the type of switches S1-Sn employed. For instance, switches S1-Sn each may include a main current path of a respective bipolar npn transistor or N-channel FET. Control electrodes of the transistors then receive input signals L1-Ln. Accordingly, an output voltage f(L1, ..., Ln) is created that represents the logic OR function (wired OR) of input signals L1-Ln. Alternatively, switches S1-Sn each may include a main current path of a respective bipolar pnp transistor or P-channel FET. Output signal f then is the logic NAND function (wired NAND; open collector/open drain logic) of input signals L1-Ln.

In order to furnish an output signal f that depends on the input signals L1-Ln, power pull-down means 20 needs to be active, i.e., power-down means 20 is to draw current from output node 30. When input signals L1-Ln are such that node 30 is pulled towards high voltage $V_H$, pull-up means 10 has to counteract pull-down means 20. In this case, the circuit consumes power since a current path through pull-up means 10 and pull-down means 20 connects node $V_H$ to node $V_L$. The amount of power consumed in this situation heavily depends on the current drained by pull-down means 20.

When this current is large, the power consumed is high. However, the time for pull-down means to discharge node 30 when switches S1-Sn are opened is low. That is, the propagation delay represented by the circuit shown is short for transitions at node 30 from a high voltage to a low voltage. Alternatively, a low current draining capability of pull-down means 20 brings the power consumption down, but at the expense of an increase in propagation delay.

In the invention, power pull-down means 20 are programmed via program signals P1-Pm. That is, the amount of current drawn from output node 30 is established by selecting the appropriate current sources I1-Im to be active, either one at a time or in a proper combination. In this way, the user accurately adjusts the power consumption of the circuit in steps, depending on how time-critical the circuit's operation is considered to be regarding cooperation with other parts of the device.

Note that a number of N different current sources that can either be turned on individually or turned off individually give rise to $2^N$ different current values. This fits in well with digital control of the current sources. Alternatively, a single current source (not shown) can be employed that is gradually controllable via the program signal applied to the source's control input.

Note also that the signals P1-Pm applied to the pull-down means specify the temporal and power consumption properties of the circuit shown, but do not affect the logic function implemented if the shown circuit is to be active. Only by turning off all current sources I1-Im is the circuit functionally removed from the device.

In a PLA, the current sources that form functional parts of the programmable logic gates may be individually controllable through the power control means. Alternatively, the programmable logic gates may be organized in sections, and the current sources may be uniformly controllable per individual section.

The power control means itself may comprise a programmable logic gate, an additional PLA or a reserved part of the PLA for storing the information to control the power consumption. Alternatively, the power control means may include a memory, such as an EEPROM. The circuit, whose power consumption is to be user-controlled by the programmable power control means, may be implemented in a fast tecnology, such as a bipolar technology (ECL, wired logic). The power control means then may be implemented in a low-power technology, for instance, using FETs of complementary conductivity type and complementary controllable.

A BiCMOS technology may be used to implement the device of the invention.

WIRED LOGIC, SECOND EXAMPLE

FIG. 2 shows the complement of the circuit of FIG. 1. Now, the complementary circuit comprises a series arrangement of programmable power pull-up means 50 and pull-down means 60 between high voltage supply node $V_H$ and low voltage supply node $V_L$. Pull-down means 60 includes a plurality of switches S1-Sn that are respectively controlled by input signals L1-Ln. Pull-up means 50 comprises current sources I1-Im. With pull-up means 50 being active, that is, supplying current to output node 70 from supply node $V_H$, node 70 provides an output voltage g(L1, ..., Ln) that is a function of input signals L1-Ln.

If switches S1-Sn each include a main current path of a respective npn bipolar transistor or N-channel FET, the output voltage g constitutes the logic NOR function. The npn bipolar transistor may be a Schottky-clamped transistor for increasing switching speed.

Similar comments as for power-down means 20 in FIG. 1 regarding the adjustment of the power consumption apply to power pull-up means 50. By way of a proper combination of active current sources I1-Im, the power consumption is tailored under the conditions of speed required in view of cooperation with other parts (not shown) of the device.

CURRENT SWITCHING LOGIC

FIG. 3 gives a transistor diagram of an example for an emitter-coupled logic (ECL) circuit in a device of the invention. The circuit's operation is based on current switching logic. The same principle is applied in source-coupled logic (SCL) and in current-mode logic (CML). Note that these types of circuit consume power in a stable state.

Basically, the circuit comprises a current switching part 100 that switches current between current path 110 and 120 in response to input signals L1-Ln. A programmable current source 130 is arranged in series with current switching part 100 between power supply nodes $V_H$ and $V_L$ in order to drive switching part 100.

Current path 110 comprises a parallel arrangement of collector-emitter paths of bipolar transistors S1-Sn that are controlled via input signals L1-Ln. Current path 120 represents a reference path and includes a reference transistor 140 that is biased by a reference signal VREF. Implemented by means of npn transistors, this architecture offers the fastest logic available, owing to the fact that the transistors all are kept out of their saturation range during operation of the circuit. In the configuration shown output signal h(L1, ..., Ln) is the logic NOR function of input signals L1-Ln.

Programmable current source 130 is similar to programmable power-down means 20 of FIG. 1 or programmable power-up means 50 of FIG. 2. As discussed under the wired logic examples of FIGS. 1 and 2, the current supplied by programmable current source 130 is tailored by means of selecting a combination of co-operating current sources I1-Im via program signals P1-Pm, the combination being appropriate under the conditions regarding speed and power consumption for this particular circuit.

CURRENT SOURCE EXAMPLE

Figure 4:
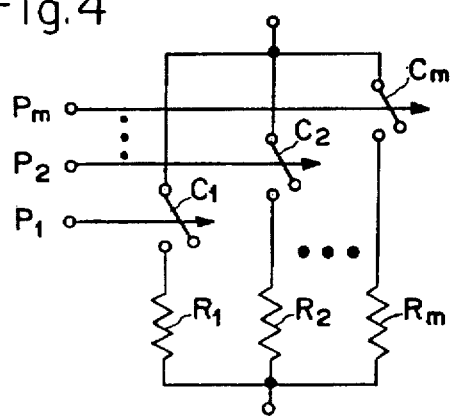
FIG. 4 shows a simple example of a programmable current source for use in the invention.

FIG. 4 gives a simple example of an embodiment for programmable power up-down means 20 of FIG. 1, programmable power pull-down means 60 of FIG. 2 and programmable current source 130 of FIG. 3. Basically, each current sources I1, ..., Im contains a resistor R1, ..., Rm, respectively. A further switch C1-Cm is arranged in series with each resistor R1-Rm. Opening or closing further switches C1-Cm in a predetermined pattern controls the aggregate current through programmable power means 20 and 50.

Preferably, resistors R1-Rm have mutually different resistances in order to have many different aggregate current values available as possible.

Further switches C1-Cm each comprise, for instance, a main current path of a respective further transistor that receives the respective program signal at its control electrode. The program signals are applied by a control unit (not shown). The control unit comprises, for instance, a RAM, a ROM, an EPROM or EEPROM, or a shift-register for storing the program signals P1-Pm. The control unit is located, for instance, in the electronic device, or is a circuit external to the device. The control signals may be stationary during operation of the device. Alternatively, the control signals may be dynamic in the course of the device's operation, thereby adapting the circuit's power consumption depending, for instance, on the circuit's use during subroutines in a program executed by a system of which the PLD is a functional part.

In another embodiment, further switches C1-Cm each comprise a fuse or an anti-fuse. Programming is accomplished by irreversibly setting the state of the considered further switch.

Note that, within the context of the invention, pull-up means 10 in FIG. 1, pull-down means 60 in FIG. 2 and current switching part 100 of FIG. 3 need not represent a primary logic OR, NOR, AND or NAND function, but may be of a more general type, as, for instance, AND-OR-INVERT.

We claim:

1. A programmable logic device comprising:
   a programmable logic circuit having a logic functionality, for receiving an input signal and outputting an output signal; and
   power control means functionally integrated with said programmable logic circuit and including a plurality of current sources connected in a cascode arrangement to the programmable logic circuit for incrementally and non-permanently modifying power consumption by the circuit under control of a program signal applied to the power control means without changing the logic functionality of said logic circuit.

2. The programmable logic device of claim 1, wherein each of the plurality of current sources can be selectively disabled.

3. A programmable logic device, comprising:
   first and second power supply nodes for receiving first and second power supply voltages, respectively;
   programmable logic circuit having (i) a logic circuit section with logic functionality for receiving a logic input signal, said logic circuit section having an output node coupled between the first and the second power supply nodes for outputting a logic signal, and (ii) a programmable current source section for supplying a current to operate the logic circuit section, said programmable current source section being coupled between the output node and one of said first and second power supply nodes, said programmable current source section being incrementally adjustable via a program signal to incrementally adjust the current through said logic circuit section without chancing the logic functionality of said logic circuit section;
   wherein the programmable current source section comprises a plurality of current branches arranged in parallel, each respective branch comprising a respective current source, and each respective current source being independently modifiable under control of the program signal.

4. An electronic device comprising:
   first and second power supply nodes; and
   a logic gate arranged between the power supply nodes, the logic gate including:
     at least one input node for receiving a logic input signal;
     an output node for providing a logic output signal in response to the logic input signal;
     a programmable logic section having a logic functionality, connected to the input and directly connected between the first power supply node and the output node for switchably coupling the output node to the first power supply node in response to the logic input signal; and
     current source means functionally integrated with said logic section and directly connected between the output node and the second power supply node for driving the logic section, the current source means being user-programmable under control of a program signal to adjust a power consumption of the logic gate to a selected level without changing the logic functionality of said logic section.

5. A programmable logic device, comprising:
   first and second power supply nodes for receiving first and second power supply voltages, respectively;
   a programmable logic circuit having (i) a programmable logic circuit section with logic functionality for receiving a logic input signal, said logic circuit portion having an output node coupled between the first and the second power supply nodes for outputting a logic output signal, and (ii) a programmable current source section for supplying a current to operate the logic circuit section, said programmable current source section being coupled between the output node and one of said first and second power supply nodes, said programmable current source section being incrementally adjustable via a program signal to incrementally adjust the current through said logic circuit section without changing the logic functionality of said logic circuit section.

6. The device of claim 5 wherein the programmable current source section comprises a parallel arrangement of a first current branch with a first current source and a second current branch with a second current source, at least the first current source being modifiable under control of the program signal.

7. The device of claim 6, wherein the first current branch comprises a switch in series with the first current source, the switch being controllable by the program signal.

8. The device of claim 7, wherein the switch comprises one of the following elements: a fuse; an anti-fuse; and a main current path of a transistor, a control electrode of the transistor receiving the program signal.

9. The device of claim 7, wherein the first current source supplies a first current, and the second current source supplies a second current, the first and second currents having mutually different values.

10. The device of claim 7, wherein the second current branch comprises a second switch in series with the second current source, the first and second switches being independently controllable by the program signal.

11. The device of claim 5, wherein the programmable logic circuit section comprises a plurality of programmable logic gates, each programmable logic gate being directly coupled to a distinct current source of said programmable current source section.

12. The device of claim 11, wherein the programmable logic gates are organized in a further plurality of logic blocks, the current sources being uniformly controllable per logic block.

13. The device of claim 11 wherein the programmable current source section comprises at least one further programmable logic gate.

14. A programmable logic device according to claim 5, wherein said programmable current source section is incremented dynamically during circuit operation.

15. The device of claim 5, wherein the programmable logic circuit section comprises wired logic circuitry and the programmable current source section includes a plurality of current sources, each of which is incrementally and independently controlled by a corresponding control signal.

16. The device of claim 5, wherein the programmable current source section includes a plurality of current sources, each of which is incrementally and independently controlled by a corresponding control signal.

* * * * *